(12) United States Patent
Adam et al.

(10) Patent No.: US 11,778,775 B2
(45) Date of Patent: Oct. 3, 2023

(54) COOLING DEVICE AND METHOD OF MANUFACTURING THE SAME

(71) Applicant: Aptiv Technologies Limited, St. Michael (BB)

(72) Inventors: Frank H. Adam, Dublin (IE); Klaus Kaufmann, Dublin (IE); Tobias Merten, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 48 days.

(21) Appl. No.: 17/231,794

(22) Filed: Apr. 15, 2021

(65) Prior Publication Data
US 2021/0392780 A1     Dec. 16, 2021

(30) Foreign Application Priority Data
Jun. 12, 2020  (EP) .................................... 20179751

(51) Int. Cl.
*H05K 7/20* (2006.01)
*H05K 1/18* (2006.01)

(52) U.S. Cl.
CPC ....... *H05K 7/20254* (2013.01); *H05K 7/2049* (2013.01); *H05K 1/18* (2013.01); *H05K 2201/066* (2013.01); *H05K 2201/10265* (2013.01); *H05K 2201/10409* (2013.01); *H05K 2201/10522* (2013.01)

(58) Field of Classification Search
CPC .... H05K 7/20254; H05K 7/2049; H05K 1/18; H05K 2201/066; H05K 2201/10265; H05K 2201/10409; H05K 2201/10522

USPC ........................................................ 361/699
See application file for complete search history.

(56) References Cited

U.S. PATENT DOCUMENTS

| | | | | |
|---|---|---|---|---|
| 4,879,629 A | * | 11/1989 | Tustaniwskyj | ...... H01L 23/4332 257/E23.091 |
| 4,920,574 A | * | 4/1990 | Yamamoto | .......... H01L 23/4332 257/E23.091 |
| 5,608,610 A | * | 3/1997 | Brzezinski | .......... H01L 23/3675 257/E23.09 |

(Continued)

FOREIGN PATENT DOCUMENTS

| | | |
|---|---|---|
| DE | 2614917 | 10/1976 |
| EP | 1020910 | 7/2000 |

(Continued)

OTHER PUBLICATIONS

"Extended European Search Report", EP Application No. 20179751. 1, dated Nov. 18, 2020, 12 pages.

(Continued)

*Primary Examiner* — Anatoly Vortman
(74) *Attorney, Agent, or Firm* — Sawtooth Patent Group PLLC

(57) ABSTRACT

A cooling device for cooling a plurality of electronic components mounted on a circuit board. The device includes a contact sheet shaped for conforming to the plurality of electronic components and comprising a mating face for mating against the plurality of electronic components and a cooled face. An enclosure is mounted to the cooled face and defines a coolant transport circuit for circulating coolant liquid therethrough. A coupling may be provided for biasing the mating face toward the plurality of electronic components.

20 Claims, 3 Drawing Sheets

(56) References Cited

U.S. PATENT DOCUMENTS

| | | | | |
|---|---|---|---|---|
| 6,043,981 | A * | 3/2000 | Markow | H01L 23/4006 257/E23.084 |
| 6,111,749 | A | 8/2000 | Lamb et al. | |
| 6,364,009 | B1 | 4/2002 | MacManus et al. | |
| 6,665,184 | B2 * | 12/2003 | Akselband | F28F 3/12 174/15.1 |
| 6,850,411 | B1 * | 2/2005 | Patel | H05K 3/301 257/E23.101 |
| 6,853,554 | B2 * | 2/2005 | Bash | H05K 7/20772 361/708 |
| 6,972,958 | B2 * | 12/2005 | Mayer | H01L 23/367 257/E23.102 |
| 7,212,409 | B1 * | 5/2007 | Belady | G06F 1/20 361/721 |
| 7,283,364 | B2 * | 10/2007 | Refai-Ahmed | H01L 23/467 165/185 |
| 7,298,617 | B2 * | 11/2007 | Campbell | H01L 23/4338 165/80.4 |
| 7,385,821 | B1 * | 6/2008 | Feierbach | H01L 23/4332 361/699 |
| 7,995,344 | B2 * | 8/2011 | Dando, III | H01L 23/433 257/713 |
| 8,373,990 | B2 * | 2/2013 | Jarmany | H05K 7/20445 361/752 |
| 8,432,691 | B2 | 4/2013 | Toftloekke et al. | |
| 8,966,747 | B2 * | 3/2015 | Vinciarelli | H01F 27/24 29/830 |
| 9,036,353 | B2 | 5/2015 | Buckman et al. | |
| 9,694,451 | B1 | 7/2017 | Ross | |
| 9,907,216 | B2 | 2/2018 | Park | |
| 10,342,119 | B1 * | 7/2019 | Mujcinovic | H05K 5/0004 |
| 10,631,438 | B2 | 4/2020 | Coteus et al. | |
| 11,076,503 | B2 * | 7/2021 | Korta | H01L 23/433 |
| 2003/0015314 | A1 * | 1/2003 | Akselband | H05K 7/1404 257/E23.098 |
| 2005/0128705 | A1 | 6/2005 | Chu et al. | |
| 2006/0227504 | A1 | 10/2006 | Chen et al. | |
| 2007/0177356 | A1 | 8/2007 | Panek | |
| 2008/0296256 | A1 | 12/2008 | Panek | |
| 2009/0213541 | A1 | 8/2009 | Butterbaugh et al. | |
| 2011/0310560 | A1 * | 12/2011 | Jarmany | H05K 7/2049 361/688 |
| 2012/0063098 | A1 | 3/2012 | Paquette et al. | |
| 2012/0103576 | A1 | 5/2012 | Toftloekke et al. | |
| 2013/0343005 | A1 | 12/2013 | David et al. | |
| 2014/0146475 | A1 | 5/2014 | Buckman et al. | |
| 2014/0233175 | A1 | 8/2014 | Demange et al. | |
| 2015/0131224 | A1 * | 5/2015 | Barina | G06F 1/20 361/679.53 |
| 2016/0291652 | A1 | 10/2016 | Rossi et al. | |
| 2017/0082222 | A1 | 3/2017 | Buvid et al. | |
| 2019/0200485 | A1 * | 6/2019 | Coteus | G06F 1/20 |
| 2019/0204023 | A1 | 7/2019 | Takken et al. | |
| 2019/0259632 | A1 | 8/2019 | Isaacs et al. | |
| 2020/0024763 | A1 | 1/2020 | Dan et al. | |
| 2020/0337181 | A1 | 10/2020 | Tian et al. | |
| 2022/0217868 | A1 * | 7/2022 | Adam | H05K 1/0203 |

FOREIGN PATENT DOCUMENTS

| | | |
|---|---|---|
| EP | 3037771 | 6/2016 |
| GB | 2310321 | 8/1997 |
| GB | 2584991 | 12/2020 |
| WO | 2010077237 | 7/2010 |
| WO | 2020035172 | 2/2020 |
| WO | 2020234600 | 11/2020 |

OTHER PUBLICATIONS

"Extended European Search Report", EP Application No. 20190978.5, dated Jan. 20, 2021, 8 pages.

"Extended European Search Report", EP Application No. 21150125.9, dated May 31, 2021, 16 pages.

* cited by examiner

COOLING DEVICE AND METHOD OF MANUFACTURING THE SAME

CROSS-REFERENCE TO RELATED APPLICATION

This application claims priority to European Patent Application Number 20179751.1, filed Jun. 12, 2020, the disclosure of which is hereby incorporated by reference in its entirety herein.

BACKGROUND

The present disclosure relates to a cooling device for cooling a plurality of electronic components mounted on a circuit board, and a method of manufacturing the same. The present disclosure is particularly relevant to cold plates for cooling electronic control units for automotive applications and most particularly to multi domain controllers (MDCs).

Some electronics components get hot during use, which can subsequently compromise their function or lead to component damage. As such, it is common to fit cooling devices to electronic circuitry to maintain their operating temperature within an acceptable tolerance. For particularly high demand applications, liquid cooling systems are often used due to their high cooling efficiency. Conventional liquid cooling systems often have a cold plate, which is a device typically having a flat metal body with an internal circuit of cooling channels or tubes through which coolant fluid may be circulated. In use, the cold plate is fitted against the electronic components and, as components get hot, heat is transferred through the body and cooling tubes into the coolant, from where it is transported away from the circuit.

Although some electronic components on a printed circuit board (PCB) can become very hot in use, other components do not. For example, a Systems-on-a-Chip (SoC) may be thought of as a 'hot component' because it typically generates large amounts of waste heat when operating. Conversely, passive components, such as diodes or capacitors, may be thought of as 'cold components' because they will generally remain relatively cool. At the same time, hot components are often geometrically lower (i.e. flatter) than surrounding cooler, passive components. Therefore, when a flat cold plate is fitted over a PCB, it is common for the plate to abut the tops of the taller, cold components, but leave a gap between the plate and the tops of the lower, hot components. As these air gaps would otherwise provide a barrier to heat transfer from the very components the cold plate is intended to cool, it is therefore necessary to fit so-called "pedestals" in these gaps. These pedestals are typically formed of the same metal as the body of the cold plate, and provide a column of thermally conductive material for establishing a thermal path from the hot component through to the cold plate.

An issue with the above conventional arrangements is that, despite the thermal conductivity of the pedestal-material, the length of the thermal path means that pedestals nevertheless present a significant thermal resistance. Pedestals thereby provide a sub-optimal thermal connection between the hot components and the coolant.

The above issue is further exacerbated by the challenge of ensuring good thermal contact between the pedestal and the hot component. In particular, air gaps between the opposing faces of the component and the pedestal could significantly reduce thermal conduction. These gaps may be anything from very tiny holes due to surface roughness, up to larger gaps caused by production variations compromising the dimensional stability of the assembly. For example, the PCB may not be perfectly flat, leading to some components being mounted further from the cold plate than others. To mitigate this, it is common to apply a layer of Thermal Interface Material (TIM) to fill these gaps and thereby improve the mating at the junction between the parts. However, as larger gaps can occur, it is typical to apply a relatively thick layer of TIM to ensure there is sufficient material to fill the gaps in their entirety. This unfortunately compromises the overall thermal conductivity because, although TIM is a better thermal conductor than air, it is not as effective as providing a very close connection between the hot component and the cooling structures.

In the patent publication US2014/0233175, disclosed is a cold plate which attempts to address some of the above issues. In this arrangement, the cold plate is provided with holes through which taller passive electronic components may project, thereby allowing the plate to sit closer to the hotter, lower height devices on the circuit board. However, there are a number of issues with this arrangement. Firstly, it is relatively complex and expensive to manufacture. For example, the tall component holes have to be formed or machined into the cold-plate metal for each specific circuit layout. Furthermore, the position of the holes is restricted to areas of the cold plate not containing the integral coolant channels or tubes running through the cold plate body, which imposes significant design restrictions. Added to that, the issue of larger pedestal gaps caused by dimensional variations is not negated. For example, deformations resulting in bending of the PCB may still cause some components to be positioned further away from the flat cooled face of the rigid cold plate. As such, the arrangement taught by US 2014/0233175 still requires TIM to be used as a gap-filler.

There therefore remains a need for an improved cooling device for cooling components mounted to a circuit board.

SUMMARY

The present disclosure concerns a cooling device and method for manufacturing a cooling device for cooling a plurality of electronic components mounted on a circuit board. The cooling device may be a cold plate for use with electronic control unit or multi domain controller mounted to a printed circuit board.

According to a first aspect, there is provided a cooling device for cooling a plurality of electronic components mounted on a circuit board, the device comprising: a contact sheet shaped for conforming to the plurality of electronic components and comprising a mating face for mating against the plurality of electronic components and a cooled face; and an enclosure mounted to the cooled face and defining a coolant transport circuit for circulating coolant liquid therethrough.

In this way, the contact sheet may establish a close thermal contact with those components mounted to the circuit board which get hot during operation. At the same time, the enclosure provides a coolant fluid pathway which is located very close to the hot components, with the relatively thin, substantially planar configuration of the contact sheet providing a short thermal path between the components and the coolant fluid being circulated therein. As such, a high cooling efficiency may be achieved, with a simple and light construction. The contact sheet is sufficiently thick to facilitate the effective transport of the heat from the hot components. In embodiments, the contact sheet is 2 mm-3 mm thick.

In embodiments, the cooling device further includes a coupling for biassing the mating face toward the plurality of electronic components. In this way, the volume of thermal interface material required to maintain an effective thermal contact is minimised. Furthermore, the mating between the contact sheet and the hot components may be maintained throughout different operating conditions, thereby providing improved cooling consistency.

In embodiments, the coupling connects the contact sheet to the circuit board. In this way, the contact sheet is secured directly to the circuit board to provide a compact assembly.

In embodiments, the coupling includes a plurality of connection points for resiliently biassing the contact sheet toward the circuit board. In this way, a localised compressive pressure may be applied to the contact sheet at a number of different locations over its footprint. For example, the contact points may be distributed to provide a more consistent compressive pressure over the whole contact sheet. Conversely, connection points may be clustered around specific components in order to ensure mating with the contact sheet is maintained.

In embodiments, the connection points comprise a fixture for connection to the circuit board and a spring coupled to the fixture for applying a biassing force to the contact sheet. In this way, the spring allows a consistent compressive pressure to be applied and maintained at the plurality of connection points.

In embodiments, the contact sheet further includes a plurality of apertures for receiving the fixtures, wherein, when connected, each fixture connects to the circuit board through a respective aperture. In this way, fixtures may be accommodated through holes that can be simply machined into the contact sheet.

In embodiments, the contact sheet is three dimensionally shaped for mating against electronic components of different heights. In this way, relatively taller or shorter hot components can be accommodated and cooled by the same contact sheet. For example, the contact sheet may be shaped to have projected regions for mating with shorter hot components and recessed regions for mating with taller hot components.

In embodiments, the contact sheet has a footprint shaped for exposing other electronic components mounted to the circuit board. In this way, the contact sheet may sit below the taller passive components, adjacent to the hot components. Furthermore, the cooling effect can also thereby be focused on the hot components.

In embodiments, the contact sheet includes a first sheet section and a second sheet section, and wherein the enclosure includes a first enclosure section mounted to the first sheet section and a second enclosure section mounted to the second sheet section, and a conduit for fluid connection of the first and second enclosure sections. In this way, the device may be provided as two or more sections which can be attached to different parts of a circuit board or to adjacent circuit boards. This allows separated clusters of hot components to be cooled with the same device, whilst minimising the volume of the contact sheet and the enclosure required to distribute coolant to those clusters.

In embodiments, the contact sheet is formed of sheet metal. In this way, a flat piece of metal may be simply bent or pressed into the required shape. At the same time, the metal may provide a high level of thermal conduction, and the thin construction minimises the volume and weight of material required.

In embodiments, the enclosure includes one or more substantially cuboidal fluid transport cavities, the fluid transport cavities interconnecting as part of the coolant transport circuit. This allows for simplified manufacturing in which the enclosure may be formed, for example, by pressing or bending sheet metal to define the cavities which make up the coolant transport circuit. In other embodiments, the enclosure includes one or more substantially oval or round fluid transport cavities.

In embodiments, the one or more fluid transport cavities may have a flattened configuration. In this way, the coolant is able to spread over a large area of the cooled face, thereby improving the efficiency at which heat is drawn from it.

In embodiments, the enclosure is formed of sheet metal. In this way, a flat piece of metal may be simply bent or pressed into the required shape. Furthermore, the enclosure may then be brazed, welded, soldered, or glued to the contact sheet to provide a fluid tight mounting for the coolant transport circuit.

In embodiments, the coolant transport circuit is defined by the space between the enclosure and the contact sheet. In this way, the coolant may directly flow over the cooled face of the contact sheet, thereby minimising the length of the thermal path between the coolant and the hot components.

According to a second aspect, there is provided a method of manufacturing a cooling device for cooling a plurality of electronic components mounted on a circuit board, the method comprising the steps of: shaping a contact sheet to conform to the plurality of electronic components, wherein the shaped metal sheet includes a mating face shaped for mating against the plurality of electronic components and a cooled face; and mounting an enclosure to the cooled face to define a coolant transport circuit for circulating coolant liquid therethrough.

In this way, a simple manufacturing method is provided for the forming a highly efficient and lightweight cooling device.

BRIEF DESCRIPTION OF THE DRAWINGS

An illustrative embodiment will now be described with reference to the accompanying drawing in which.

DETAILED DESCRIPTION

Figure 1:
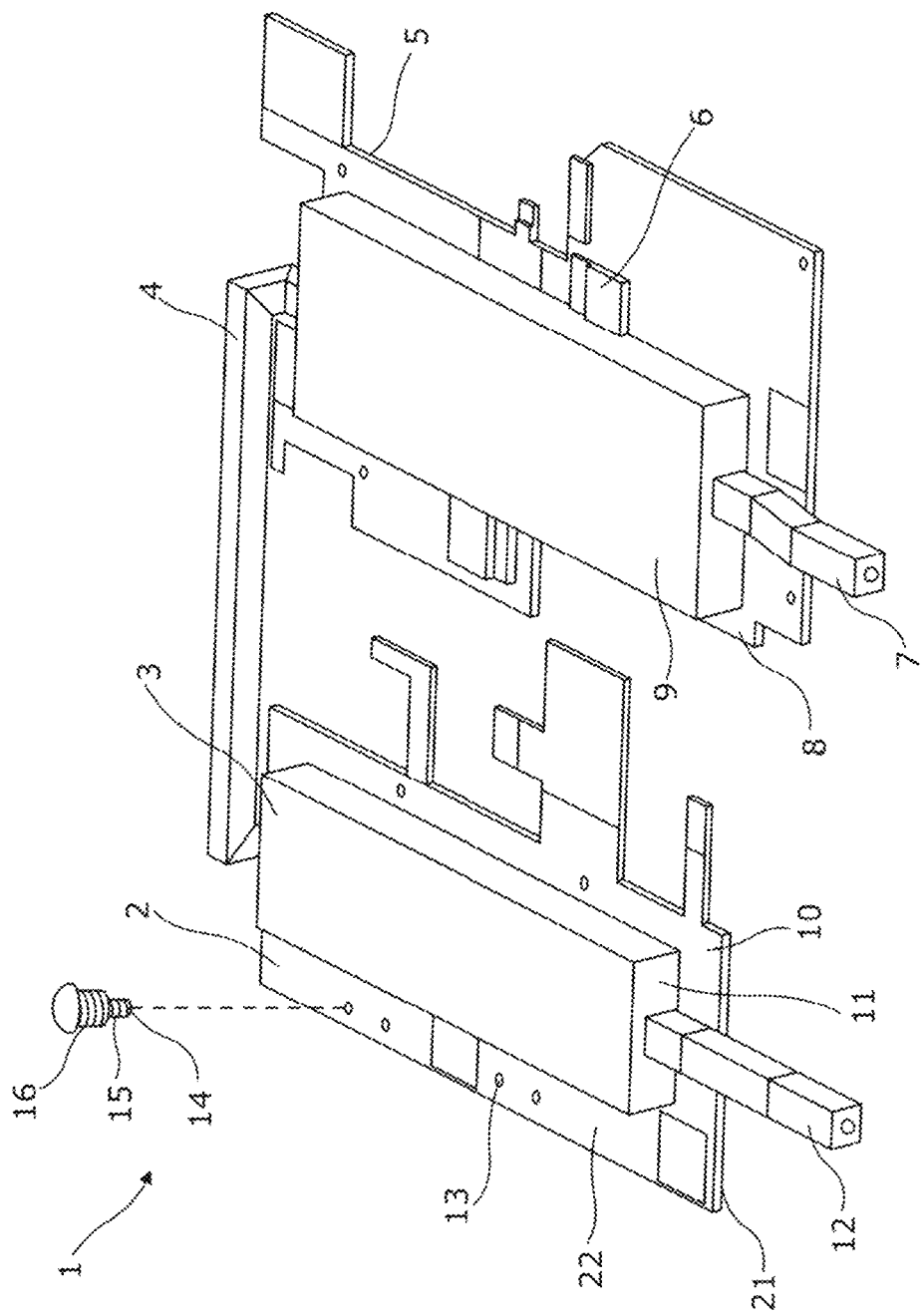
FIG. 1 shows an isometric view of a cooling device.

FIG. 1 shows an embodiment of a cooling device 1 comprising a contact sheet 2 and an enclosure 3 mounted to the contact sheet 2.

The contact sheet 2 is formed from a sheet metal material, such as aluminium, and has a footprint 5 that is shaped to overlay the hot electronic components on a circuit board. The shaping of the contact sheet 2 may be achieved by various methods, for example by stamping, deep drawing, hydro forming, electron-beam cutting, and 3D-printing.

In this embodiment, the contact sheet 2 includes first and second sections 8 and 10 for overlaying different regions of the circuit board. The bottom face 21 of the contact sheet 2 provides a mating surface which mates with the top faces of the hot components. To facilitate this mating, the mating surface 21 of the contact sheet 2 has component formations 6, where the sheet material bends to form projections and depressions corresponding to the tops of the associated hot components. As such, when fitted, the contact sheet 2 may be seated on top of the plurality of hot components, with differences in vertical height between different components being accommodated by the three-dimensional shaping of the sheet metal. At the same time, the planar configuration of the contact sheet 2 provides a relatively thin configuration, allowing some flex to accommodate more minor height differences between components and across the circuit board.

The contact sheet 2 further includes a plurality of fixture apertures 13 for receiving biassing fixtures 14, which are used to connect the contact sheet 2 to a circuit board. FIG. 1 shows a single biassing fixture 14. Each biasing fixture 14 includes a screw 15 and a compression spring 16 arranged coaxially with the screw 15.

The enclosure 3 is mounted to the top surface 22 of contact sheet 2 and forms a conduit for the coolant. In this embodiment, the enclosure 3 is formed of a three-dimensionally shaped metal sheet, which is connected directly to the upper surface of the contact sheet 2 by, for example, brazing, soldering, or welding. The coolant fluid pathway is thereby provided by the space between the two sheet metals. The sheet may be shaped, for example, by stamping, deep drawing, hydro forming and electron-beam cutting. In this embodiment, the enclosure 3 is defined by a number of substantially cuboid sections to simplify the shaping process.

In this embodiment, the enclosure 3 includes a first chamber 9 mounted on the first contact sheet section 8 and a second chamber 11 mounted on the second contact sheet section 10. The first and second chambers 9 and 11 are fluidly connected by elevated duct 4. As such, the enclosure 3 defines a fluid circuit for circulating coolant between an inlet pipe 7 feeding the first chamber 9 and an outlet pipe 12 for returning coolant back the pumping and refrigeration system. The inlet and outlet pipes 7 and 12 may be made of metal or polymer material and may have round or rectangular cross sections.

Figure 2:
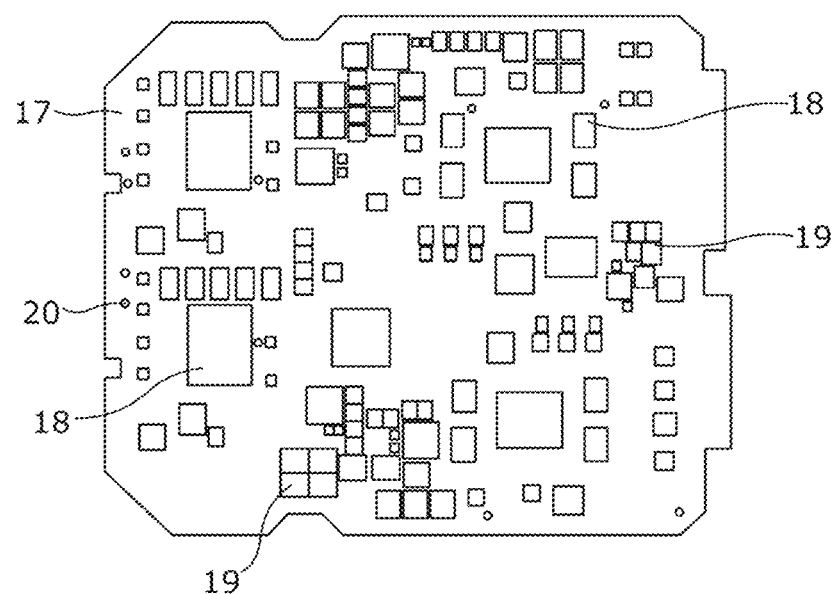
FIG. 2 shows a top view of an illustrative circuit board.

FIG. 2 shows a top view of an illustrative circuit board 17 onto which the cooling device 1 shown in FIG. 1 may be attached. The circuit board 17 is a printed circuit board comprising a plurality of components, some of which may be classed as hot components 18 in that they generate heat during operation and require cooling, and some of which may be classed as cold components 19 in that they do not require active cooling during operation. In FIG. 2, the hot components 18 are shown shaded darker than the cold components 19. The circuit board 17 is further provided with a number of threaded cavities 20 for receiving the screw 15 of biassing fixtures 14.

Figure 3:
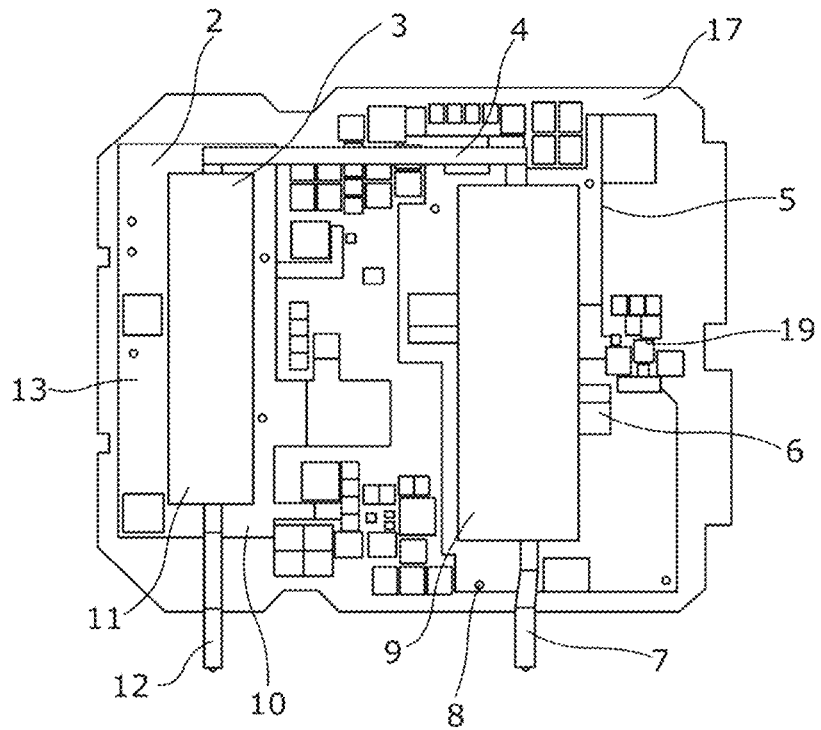
FIG. 3 shows a top view of the cooling device shown in FIG. 1 fitted to the circuit board shown in FIG. 2.

FIG. 3 shows a top view of the cooling device 1 fitted over the circuit board 17. As shown, the footprint 5 of contact sheet 2 is configured to align with and cover at least the hot components 18. In instances where certain hot components are remote to the main clusters of hot components, the footprint 5 may comprise metal strips extending from the main body of the contact sheet 2 for covering these remote hot components. In some embodiments, these strips could be three dimensionally shaped in order to bridge over obstacles, such as other components, which may otherwise be in the way. With the hot components 18 covered by contact sheet 2, the cold components 19 may be left exposed. This thereby allows the contact sheet 2 to seat closer to the circuit board 17, against the flatter hot components 18 and lower than the tops of the cold components 19.

Figure 4:
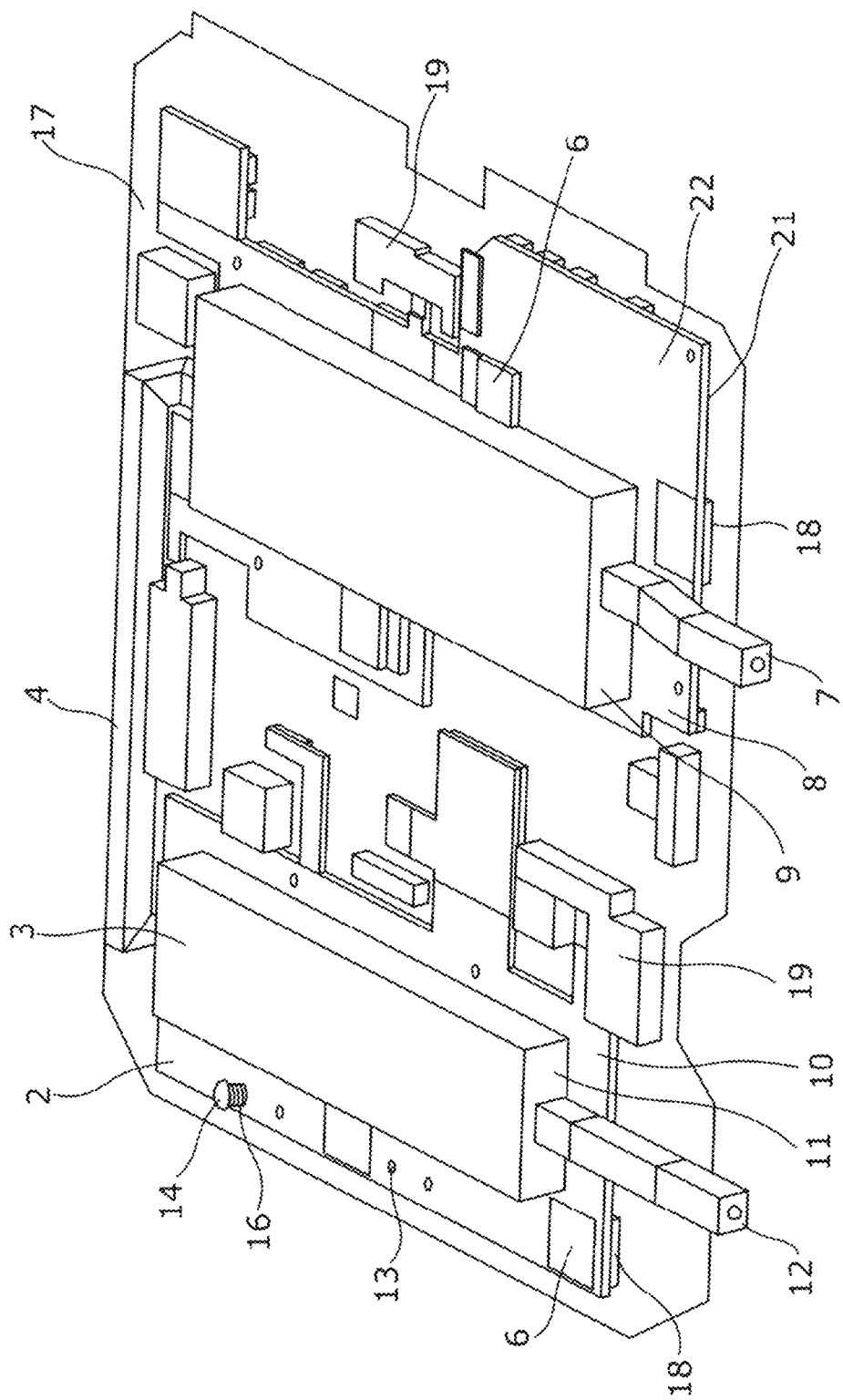
FIG. 4 shows an isometric view of the cooling device shown in FIG. 1 fitted to the circuit board shown in FIG. 2.

As shown in the isometric view shown in FIG. 4, when the cooling device 1 is fitted to the circuit board 17, the bottom face 21 of the contact sheet 2 mates with the top faces of hot components 18. Biassing fixtures 14 are installed through each fixture aperture 13 such that their screws 15 extend through the apertures 13 and engage into the corresponding threaded cavity 20 provided on the circuit board 17. In FIG. 4, a single biassing fixture 14 has been connected. Once connected, the spring 16 is braced between the screw's head at the top and the contact sheet 2. As such, the spring 16 applies a compressive force against the contact sheet 2 for biassing it into contact with the hot components 18 it overlays.

Importantly, the springs 16 provide a consistent compressive force which allows mechanical stresses arising due to external vibrations, as well as different rates of thermal expansion between different hot components 18, to be accommodated. As such, a good thermal contact is maintained between the contact sheet 2 and the underlying hot components 18 throughout different operating conditions. For example, contact can be maintained despite variations in the operating loads and the thermal expansion coefficients of different components. Furthermore, in automotive applications, contact can be maintained even when vibrations arise during driving. This may thereby compensate for any dimensional variations in the assembly which could otherwise result in larger air gaps between the contacting surfaces. As a result, the need for Thermal Interface Material (TIM) is limited to compensating for any residual gaps that could arise due to the surface roughness of the hot components 18 and contact sheet 2. Therefore, only a very thin layer of TIM is required.

In use, coolant, for example a water/glycol mixture, is pumped through inlet pipe 7, enters and fills the first chamber 9. From here, the coolant flows though elevated duct 4, from where it enters and fills second chamber 11, before exiting through outlet pipe 12. As such, coolant is flooded over the surface area occupied by the enclosure 3, drawing heat from the top surface 22 of the contact sheet 2. In automotive applications, the inlet and outlet pipes 7 and 12, may be fed by the vehicle's cooling system.

With the above arrangement, the contact sheet 2 may provide a good thermal contact with the hot components 18, whilst allowing the coolant to be located much closer to those hot components 18 than they would in a conventional cold plate. At the same time, the contact sheet 2 contains less material compared to conventional cold plates. As such, a very high cooling efficiency may be achieved.

It will be understood that the embodiment illustrated above shows an application only for the purposes of illustration. In practice, embodiments may be applied to many different configurations, the detailed embodiments being straightforward for those skilled in the art to implement.

For example, although the above illustrative embodiment describes the enclosure as a sheet material fitted to the contact sheet, other embodiments may involve other constructions. For example, a polymer enclosure and tubing/fluid transport cavities may be used, which could reduce the cost and weight of the assembly. Polymer enclosures may be fixed to the contact sheet, for example, by gluing, for example. In other embodiments, it is also envisaged that the enclosure may be provided as tubing secured to the contact sheet.

What is claimed is:
1. A system, comprising:
 a device configured to cool a plurality of electronic components having different heights and mounted on a circuit board, the device comprising:
  a contact sheet formed of sheet metal and conforming to the plurality of electronic components, the contact sheet comprising a bottom face that is three-dimen- sionally shaped to mate against the plurality of electronic components having the different heights, the contact sheet further comprising a top face that has a surface with varying heights; and an enclosure formed of sheet metal and mounted to the top face of the contact sheet, a coolant transport circuit for circulating coolant liquid therethrough being defined by a space between the top face of the contact sheet and the enclosure.

2. The system according to claim 1, the device further comprising:

a coupling that biases the bottom face of the contact sheet toward the plurality of electronic components.

3. The system according to claim 2, wherein the coupling connects the contact sheet to the circuit board.

4. The system according to claim 3, wherein the coupling comprises a plurality of connection points that biases the contact sheet toward the circuit board.

5. The system according to claim 4, wherein the connection points comprise a fixture to connect to the circuit board and a spring coupled to the fixture and configured to apply a bias force to the contact sheet.

6. The system according to claim 5, wherein the contact sheet further comprises a plurality of apertures configured to receive the fixtures, wherein, when connected, each fixture connects to the circuit board through a respective aperture.

7. The system according to claim 1, wherein the contact sheet has a footprint shaped to expose other electronic components mounted to the circuit board.

8. The system according to claim 1,
wherein the contact sheet comprises a first sheet section and a second sheet section, and
wherein the enclosure comprises a first enclosure section mounted to the top face of the first sheet section and a second enclosure section mounted to the top face of the second sheet section, the enclosure further comprises a conduit for fluid connection of the first and second enclosure sections.

9. The system according to claim 1, wherein the enclosure comprises one or more substantially cuboidal fluid transport cavities, the fluid transport cavities being interconnected as part of the coolant transport circuit.

10. The system according to claim 9, wherein the one or more substantially cuboidal fluid transport cavities have a flattened configuration.

11. The system according to claim 1, wherein the contact sheet is conformed to each electronic component of the plurality of electronic components.

12. A method comprising:
manufacturing a device configured to cool a plurality of electronic components having different heights and mounted on a circuit board, wherein manufacturing the device comprises:

shaping sheet metal into a contact sheet to conform to the plurality of electronic components, wherein the contact sheet comprises a bottom face that is three-dimensionally shaped to mate against the plurality of electronic components having the different heights, the contact sheet further comprises a top face that has a surface with varying heights; and mounting an enclosure to the top face of the contact sheet to define a coolant transport circuit for circulating coolant liquid therethrough in a space between the top face of the contact sheet and the enclosure.

13. The method according to claim 12, wherein shaping the contact sheet comprises shaping the contact sheet to have a footprint shaped to expose other electronic components mounted to the circuit board.

14. The method according to claim 12, wherein manufacturing the device further comprises forming the enclosure from sheet metal.

15. The method according to claim 12, wherein manufacturing the device further comprises biasing the bottom face of the contact sheet toward the plurality of electronic components using a coupling.

16. The method according to claim 15, wherein the coupling connects the contact sheet to the circuit board.

17. The method according to claim 15, wherein the coupling comprises a plurality of connection points biasing the contact sheet toward the circuit board.

18. The method according to claim 12, wherein:
the contact sheet comprises a first sheet section and a second sheet section, and
the enclosure comprises a first enclosure section mounted to the top face of the first sheet section and a second enclosure section mounted to the top face of the second sheet section, the enclosure further comprising a conduit for fluid connection of the first and second enclosure sections.

19. The method according to claim 12, wherein the enclosure comprises one or more substantially cuboidal fluid transport cavities, the fluid transport cavities being interconnected as part of the coolant transport circuit.

20. The method according to claim 19, wherein the one or more substantially cuboidal fluid transport cavities have a flattened configuration.

* * * * *